United States Patent [19]

Gaude

[11] Patent Number: 4,639,616

[45] Date of Patent: Jan. 27, 1987

[54] CIRCUIT FOR CONTROLLING THE BASE OF A POWER TRANSISTOR USED IN HIGH TENSION SWITCHING

[75] Inventor: Maurice Gaude, La Tronche, France

[73] Assignee: La Telemecanique Electrique, France

[21] Appl. No.: 561,256

[22] Filed: Dec. 14, 1983

[30] Foreign Application Priority Data

Dec. 14, 1982 [FR] France .................. 82 20906

[51] Int. Cl.$^4$ .................. H03K 3/45; H03K 17/60
[52] U.S. Cl. .................. 307/270; 307/253; 307/570; 307/280; 307/246; 307/549
[58] Field of Search .............. 307/253, 254, 256, 270, 307/259, 246, 570, 314, 280, 282, 549, 547, 362

[56] References Cited

U.S. PATENT DOCUMENTS

| | | | |
|---|---|---|---|
| 3,566,158 | 2/1971 | Paine | 307/253 |
| 4,339,671 | 7/1982 | Park et al. | 307/253 |
| 4,393,316 | 7/1983 | Brown | 307/270 |
| 4,430,586 | 2/1984 | Hebenstreit | 307/570 |

Primary Examiner—Stanley D. Miller
Assistant Examiner—Richard Roseen
Attorney, Agent, or Firm—William A. Drucker

[57] ABSTRACT

A first transistor ($T_2$) is connected between the secondary winding of a pulse transformer (TC) and the base of a power transistor ($T_6$) to be controlled. A second and third transistors ($T_3$, $T_4$) are arranged as a latch with dominant reset. The third transistor ($T_4$) turns on the first ($T_2$) during the interval of a control pulse, provided that the second ($T_3$) is off. The second transistor further plays the role of a comparator and is associated with means ($R_{16}$, $R_{15}$, $R_{14}$, $R_{13}$, CTN) for tapping a voltage representative of the current delivered by the power transistor to a load and for comparing the said voltage with its base-emitter voltage. A resistor-capacitor circuit ($R_{17}$–$C_2$) is arranged for supplying a negative bias once a capacitor ($C_2$) has been energized by the pulse current and associated to a fourth transistor ($T_5$) arranged for applying the said negative bias to the base of the power transistor during the intervals between two successive pulses.

10 Claims, 3 Drawing Figures

CIRCUIT FOR CONTROLLING THE BASE OF A POWER TRANSISTOR USED IN HIGH TENSION SWITCHING

BACKGROUND OF THE INVENTION

The invention relates to the control of the base of a power transistor used in high tension switching.

In choppers and chopped power supplies of a relatively low power, for example between 30 W and 500 W, a power transistor is generally used whose collector-emitter Vce bias is formed by the rectified AC mains and to the base of which are applied current pulses, of a frequency between 20 and 100 KHz for example. This transistor operates under saturated ON condition during the interval of a pulse, and under off condition in the intervals between one pulse and the next pulse.

To increase the switching frequency, while minimizing the losses and, when the circuit comprises a regulation loop, so as to obtain satisfactory regulation dynamics, it is important to minimize the saturation storage time of the transistor, which is often achieved by providing the base control device with a so-called "anti-saturation" diode circuit, which ensures that the transistor will not become saturated in the ON condition.

DESCRIPTION OF THE PRIOR ART

To this end, it has already been proposed, more especially in patents U.S. Pat. No. 3,566,158 and GB Pat. A No. 1 396 314, to use anti-saturation circuits for controlling the base of a transistor. However, for reasons which will be explained further on, it has proved desirable, in such control devices, to provide means for applying a reverse bias voltage to the transistor during the off condition.

SUMMARY OF THE INVENTION

A first aim of the invention is then to propose a circuit for controlling a transistor, using a relatively simple pulse transformer, having only a single primary winding and a single secondary winding and in which a reverse bias voltage supplied by the transformer is applied to the base of the transistor during turn off thereof.

To arrive at this result, the control circuit of the invention uses a pulse transformer comprising a primary winding connected to the base of the power transistor by means of a first switching device which is made conducting for the duration of each pulse so as to obtain the ON condition of the transistor. This circuit is more particularly characterized in that it further comprises means for reversely biassing the base of the power transistor which comprise at least one capacitor, a circuit for charging said capacitor, from the secondary winding of the transformer, to a voltage corresponding to a turn off voltage of the transistor, and circuit means connecting said capacitor to the base of said transistor, this circuit means comprising a second switching device which is made conducting in the intervals between one pulse and the next pulse. Moreover, self-protection of the transistor requires the use of means for limiting the current which flows therethrough, so the comparison of this current with a reference voltage, which is generally obtained by means of a voltage source. When the current is tapped, at the level of the pulse transformer, the circuit is relatively complex, such is particularly the case in the circuit described in the patent U.S. Pat. No. 4,339,671 in which monitoring of the current supplied by the transistor is provided by means of a current transformer. It is clear that the addition of such current limiting means leads to relatively complex and expensive base control circuits.

The invention has therefore also as its aim to integrate in the previously described base control circuit a limiter circuit of a such simpler and yet effective type. Thus, according to another feature of the invention, this circuit comprises means for tapping a voltage representative of a current which flows in the transistor, comparing it with a threshold and interrupting the conduction of said first switching device should said threshold be exceeded.

According to another feature of the invention, the control terminal of said first switching device is connected to the output of a latch with dominant reset whose setting input received the rising and falling edges of the pulses transmitted by the secondary winding of the transformer and whose reset input is connected to the output of a threshold device which receives at one of its inputs a DC threshold voltage and at the other input a voltage representative of the current flowing in the transistor. According to a preferred embodiment of the invention, said first-switching device comprises a second transistor (the first transistor being the power transistor) and the latch with dominant reset comprises a third transistor connected by its collector to the base of the second transistor, and whose base is connected to its emitter through the emitter-collector junction of a fourth transistor playing the role of comparator, whose base is connected to means for tapping a voltage representative of the current delivered by the first transistor and comparing said voltage with its base-emitter voltage. Moreover, the circuit for charging said capacitor may advantageously comprise a resistor in series with the secondary winding of the transformer, and to the terminals of which is connected in parallel a circuit comprising in series a diode and said capacitor. This capacitor may further be connected to the emitter of a fifth transistor adapted for comparing the reverse voltage generated by the secondary of the transformer during the intervals between one pulse and the next pulse, with its own base-emitter voltage and for applying said negative bias voltage to the base of the first transistor during said intervals between one pulse and the next pulse. Thus, by means of a simple circuit, the invention allows the three previously mentioned functions to be obtained, namely anti-saturation, the generation of a negative base bias and limitation of the current delivered by the power transistor, by means of a small number of components and without using additional voltage sources.

BRIEF DESCRIPTION OF THE DRAWINGS

Other features and advantages of the invention will appear clearly from the following detailed description.

In the accompanying drawings.

DESCRIPTION OF THE PREFERRED EMBODIMENT

Figure 1:
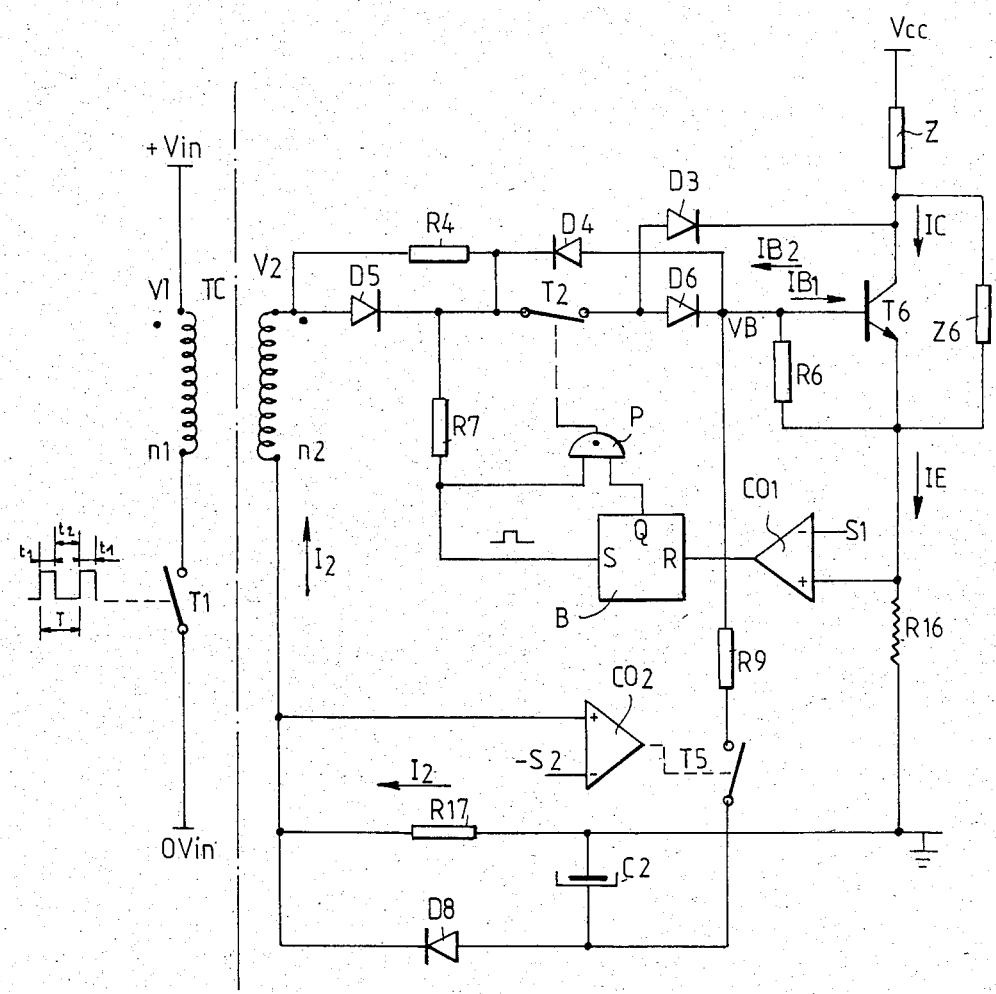
FIG. 1 is a general diagram of a circuit for controlling the base of a power transistor used in high voltage switching, in accordance with the invention.
Figure 2:
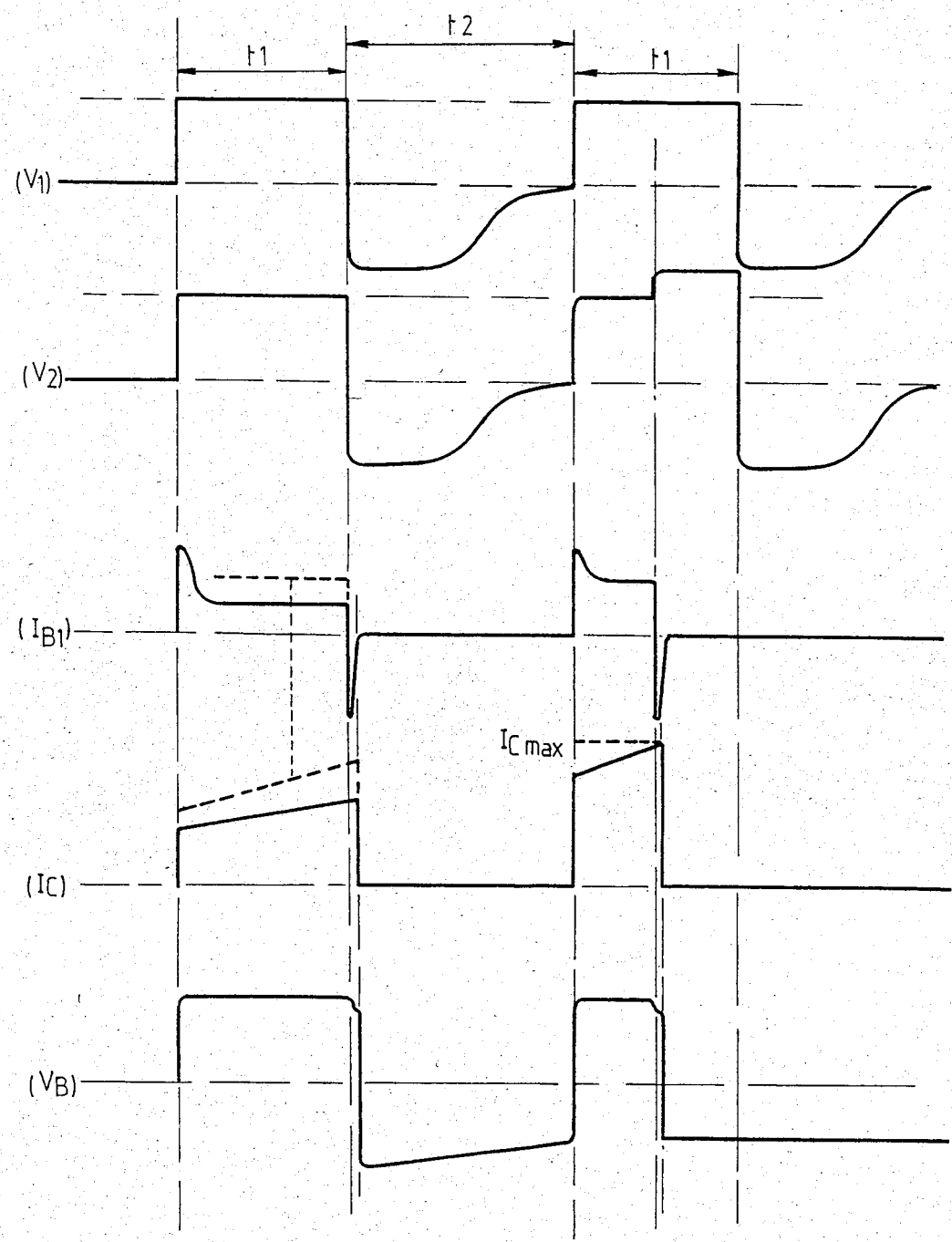
FIG. 2 shows the wave-forms at different points of the circuit of FIG. 1.
Figure 3:
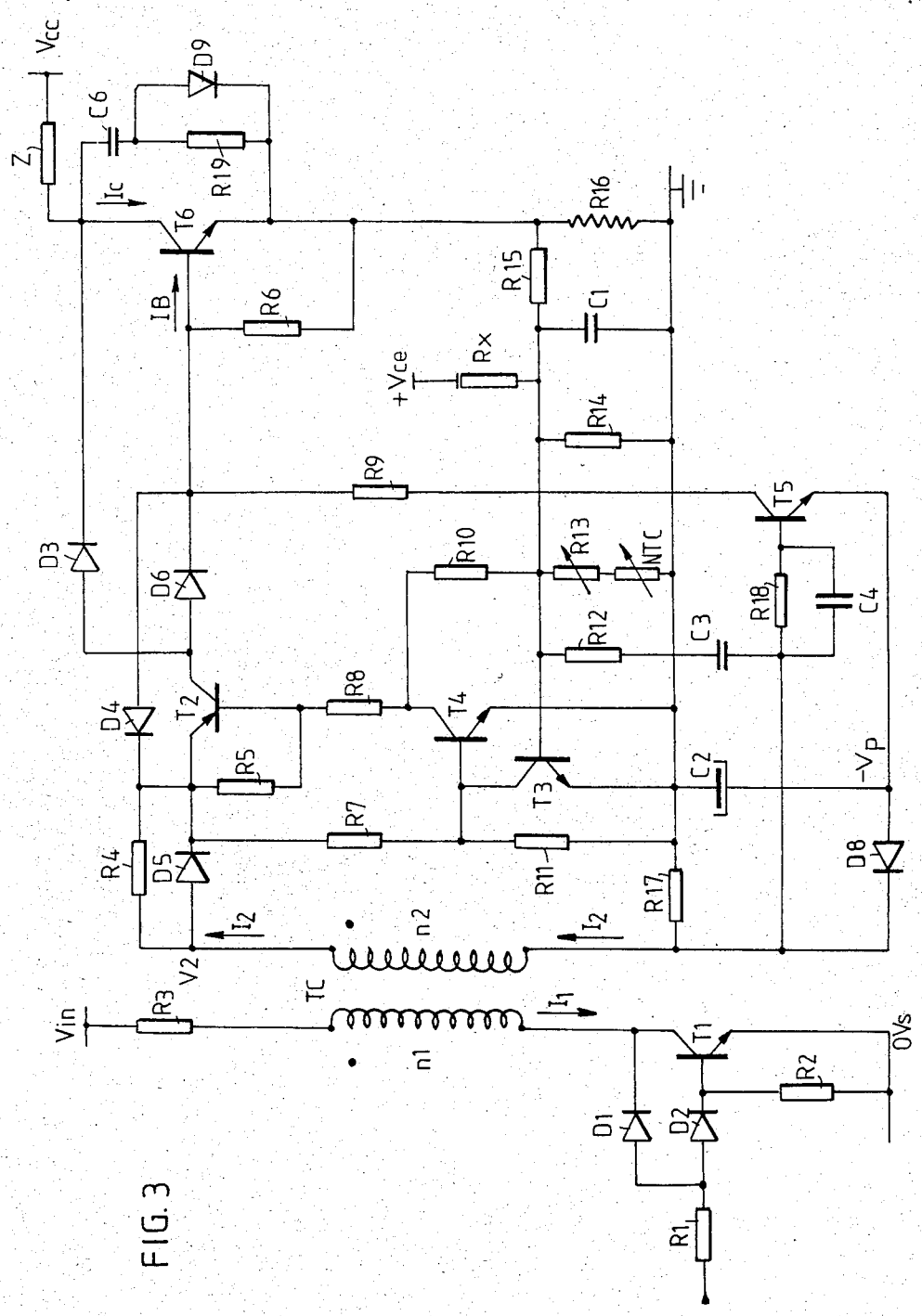
FIG. 3 shows a preferred ambodiment of said circuit. The same reference numbers designate similar components in FIGS. 1 and 3.

The circuit shown in FIGS. 1 and 3 comprises a power chopping transistor $T_6$ whose base is to be controlled, connected between the positive terminal $V_{cc}$ and the ground terminal ground of an appropriate DC voltage, with a load Z connected to its collector and a current measuring resistor $R_{16}$ connected to its emitter. A switching assisting network $Z_6$, known per se (FIG. 1) is illustrated in FIG. 3 as formed by a capacitor $C_6$ in series with a resistor $R_{19}$ and a diode $D_9$ in parallel across $R_{19}$. This network is connected in parallel across the transistor $T_6$. The control pulses, of period T (FIG. 2), with conduction duration $t_1$ and non conduction duration $t_2$, are applied to a switch $T_1$ (FIGS. 1 and 3) connected in the primary winding $n_1$ of a transformer TC supplied with a DC voltage $T_{in}$.

In the preferred embodiment of FIG. 3, switch $T_1$ is a bipolar transistor whose base receives the control pulses through a bridge formed by resistors $R_1$ and $R_2$; a diode $D_2$ connects resistor $R_1$ to said base, whereas a diode $D_1$ connects the collector of $T_1$ to the common point between $R_1$ and $D_2$. A resistor $R_3$ is connected in series with the primary winding of the transformer. In FIGS. 1 and 3, the hot point of the secondary winding $n_2$ of transformer TC is connected to the base of transistor $T_6$ through a diode $D_5$, a switch $T_2$ and a diode $D_6$. A diode $D_3$ connects the common point between switch $T_2$ and diode $D_6$ to the collector of transistor $T_6$ and, with diode $D_6$, forms, for this latter transistor $T_6$, an anti-saturation device well known per se. A resistor $R_6$ connects the base of transistor $T_6$ to its emitter. Between the anode of diode $D_6$ and the hot point of the secondary winding $n_2$ there is connected in parallel across the circuit $D_5T_2D_6$, a series circuit formed by a diode $D_4$ and a resistor $R_4$.

Moreover, the secondary winding $n_2$ of transformer $T_C$ is connected, on the other side, to the terminal ground through a resistor $R_{17}$ to the terminals of which is connected in parallel a circuit comprising, in series, a capacitor $C_2$ and a diode $D_8$.

Switch $T_2$ is controlled by a latch B (FIG. 1) forming an RS flip-flop with R dominant which receives, at its set input S, the rising and following edge of the pulse transmitted by the diode $D_5$ and a resistor $R_7$ and whose reset input R is connected to the output of a comparator $CO_1$. The negative input of this latter receives a DC threshold voltage $S_1$ and, at its positive input, the voltage $R_{16} \times IE$ is applied to the terminals of a resistor $R_{16}$, connecting the emitter of transistor $T_6$ to the terminal $OV_{ce}$, IE being the emitter current of transistor $T_6$.

An AND gate, designated P in FIG. 1, has its output connected to the control input of switch $T_2$ and its inputs connected respectively to the Q output of latch B and to resistor $R_7$.

A comparator $CO_2$ has its positive input connected to the ground point of the secondary winding, whereas to its negative input is applied a DC threshold voltage $-S_2$. The output of the comparator $CO_2$ controls a switch $T_5$, connected to the anode of the diode $D_6$ and to the base of transistor $T_6$ through a resistor $R_9$ and to the connection between capacitor $C_2$ and diode $D_8$.

In a preferred embodiment of FIG. 3, switches $T_2$ and $T_5$ are formed by bipolar transistors and comparators $CO_1$ and $CO_2$ are formed respectively by a transistor $T_3$ (bipolar or MOS) and by transistor $T_5$, $T_3$ and $T_5$ therefore playing the double role of comparator and switch.

The threshold $S_1$ which corresponds to the base-emitter voltage of transistor $T_3$ is compared with a voltage defined by a voltage divider bridge connected in parallel across resistor $R_{16}$ and which comprises a resistor $R_{15}$ connecting the emitter of transistor $T_6$ to the base of transistor $T_3$ and a circuit connecting the base of transistor $T_3$ to terminal ground, this circuit comprising in series an adjustable resistor $R_{13}$ and a resistor with negative temperature coefficient NTC, chosen for compensating the variations in the base-emitter voltage of the transistor $T_3$ with the temperature. In this circuit ($R_{13}$,NTC) are connected in parallel a capacity $C_1$ as well possibly as a resistor $R_{14}$ shown with broken lines.

Furthermore, according to a particularly advantageous embodiment of the invention, the base of the transistor $T_3$ may be further connected, through a resistor $R_X$, to a terminal $+Vce$ brought to a voltage representative of the emitter-collector voltage of transistor $T_6$, the purpose of this circuit being to correct the measurement of the emitter current of transistor $T_6$ as a function of the amplitude of the collector-emitter voltage of transistor $T_6$. This circuit, shown in FIG. 3, thus contributes to obtaining limitation of the power switched by transistor $T_6$, independently of the power supply voltage through the resistor $R_{16}$ (the current limitation threshold is then dependent on the voltage Vce), and independently of the temperature, through the negative temperature coefficient resistor NTC.

The base of transistor $T_3$ is further connected to the base of transistor $T_5$ through a resistor $R_{12}$, a capacitor $C_3$ and the parallel circuit formed by a resistor $R_{18}$ and a capacitor $C_4$, whose common point with capacitor $C_3$ is connected to the ground point of the secondary winding.

Threshold $S_2$ corresponds to the voltage $V_{BE}$ of transistor $T_5$. The latch B of FIG. 1 is, in FIG. 3, formed by the two transistors $T_3$ and $T_4$ relooped by the resistor $R_{10}$, whereas the gate P is formed by transistor $T_4$ and resistors $R_7$ and $R_5$, $R_8$, connected as shown in FIG. 3.

In FIG. 2 there is shown: the voltage $V_1$ at the terminals of the primary winding; the voltage $V_2 = V_1 \cdot (n_2/n_1)$ at the terminals of the secondary windings; the current $IB_1$ in the base of transistor $T_6$; the current IC in the collector of transistor $T_6$ and the base voltage $V_B$ of transistor $T_6$. The first period $t_1 + t_2$ shown corresponds to normal operation; the second period corresponds to self-protection operation.

Normal operation is as follows:

At the beginning of the time interval $t_1$, voltage $V_2$ appears at the terminals of the secondary winding $n_2$ and, consequently, latch B (FIG. 1) is latched at a logic level one. The output of the gate P is therefore at logic level one 1 and switch $T_2$ closes. The anti-saturation device then applies a current $IB_1$ to the base of transistor $T_6$. The current $I_2$ charges capacitor $C_2$, which is transmitted through resistor $R_{17}$ and diode $D_8$ to the base of transistor $T_6$ during the time interval $t_2$ for negatively biassing the said base. There can be seen, because of this charge, a peak of the current $IB_1$ at the beginning of the interval $t_1$. (FIG. 2)

This current peak accelerates the switching on of transistor $T_6$.

The output of comparator $CO_2$ is at logic level zero and, consequently, switch $T_5$ is open.

At the end of time $t_1$, the voltage $V_2$ is cancelled out before being reversed and, consequently, the output of gate P passes to logic level zero and switch $T_2$ opens.

The current $I_2$, so the voltage at the terminals of resistor $R_{17}$, is reversed, which causes the output of comparator $CO_2$ to pass to logic level one.

The result is that switch $T_5$ closes.

The transistor $T_6$ is in the off condition and its base is negatively biassed by the voltage $-V_p$, transmitted through transistor $T_5$ and resistor $R_9$. This negative biassing provides immunity to noise and improves the voltage resistance in the cut off condition.

The base current $IB_2$ corresponding to the accumulated charges is discharged, on the one hand through transistor $T_5$ with an intensity limited by resistor $R_9$ and on the other hand in the secondary winding through diode $D_4$ and resistor $R_4$, as long as voltage $V_2$ is negative. Once the transformer is demagnetized, $V_2$ returns to zero. The base voltage of transistor $T_6$ is however maintained negative because of the voltage $-V_p$.

The self-protection operation is the following:

If it happens that the emitter current $I_E$ of transistor $T_6$ reaches or exceeds $S1/R16$, the output of comparator $CO_1$ passes to 1 and resets the latch B. The result is that transistor $T_2$ opens immediately and the current $I_2$ is cancelled out despite the fact that $V_2$ is maintained at a positive value for the whole time $t_1$.

The cancelling of $I_2$ causes switch $T_5$ to close and the base voltage of transistor $T_6$, which is in the OFF condition, is maintained at a negative value. As soon as transistor $T_6$ passes to the off condition, current $I_E$ decreases. So that the current limiting circuit which has just been described does not start oscillating, it is important for the effect of the emitter current overshoot to be memorized for the whole of the remainder of time $t_1$. This result is obtained because latch B is adapted so as to be held at logic level zero as long as a new rising edge of voltage $V_2$ is not applied thereto.

If we now consider the practical circuit of FIG. 3, as soon as current limitation has taken place, resistor $R_{12}$ and capacitors $C_3$-$C_4$ have a useful effect in accelerating the enabling of transistor $T_5$, so the negative biasing of the base of transistor $T_6$. In fact, resistor $R_{12}$ and capacitor $C_3$ play the role of a differentiator which applies a negative pulse providing a negative bias at the beginning of a falling edge of the positive half-wave.

The memory function of the latch formed by $T_3$ and $T_4$ is provided by resistor $R_{10}$; in fact, as soon as transistor $T_4$ is off, the base potential of transistor $T_3$ assumes, because of the current flowing through resistors $R_{10}, R_{13}, NTC$, a value such that transistor $T_4$ is maintained in the off condition at the beginning of conduction of transistor $T_6$. The action of transistor $T_3$ (which normally plays also the role of comparator $CO_1$) is therefore masked for a short time (of the order 1 $\mu s$) by capacitor $C_1$, resistor $R_{12}$ and capacitor $C_3$, which also form a low-pass filter eliminating the very rapid transitories, which prevents transistor $T_4$ from being latched off inopportunely under the effect of the substantial parasite current peaks likely to occur at the time of latching on.

It can then be finally seen that there is provided, by means of a simple circuit formed with a small number of current and very inexpensive components and a single pulse transformer, without using any source of positive or negative low voltage, a base control circuit comprising insulation between the control circuit and the switched load (transformer TC) and fulfilling efficiently the functions of minimizing the storage time of the chopper transistor (anti-saturation diodes), of applying a negative base bias during disabling (source resistor $R_{17}$, diode $D_8$, capacitor $C_2$, comparator $CO_2$ and switch $T_5$) and of self-protection of the transistor (measuring resistor $R_{16}$, comparator $CO_1$, latch B and switch $T_2$).

It goes without saying that, although the embodiment shown in FIG. 3 is preferred, different variants may be devised by a man skilled in that art, without departing from the scope and spirit of the invention.

What is claimed is:

1. A base drive and control circuit for a bipolar power transistor having a base, a collector and an emitter through the collector emitter path of which a current flows when a turn on biasing voltage is applied to the base, whereas the power transistor is cut off when a turn off voltage is applied to the base, said control circuit comprising:
   i—a pulse transformer having primary and secondary windings;
   ii—source means for applying control pulses of one polarity across the primary winding;
   iii—first switch means connecting the secondary winding to the base of said power transistor, said first switch means having a control input;
   iv—first control means, connected to the control input of said first switch means and to the secondary winding, for closing said first switch means during the interval of each control pulse;
   v—a capacitor;
   vi—first circuit means connected to the secondary winding and to said capacitor for charging said capacitor to said turn off voltage;
   vii—second switch means connecting said capacitor to the base of said power transistor, said second switch means having a control input, and
   viii—second control means, connected to the secondary winding and to the control input of said second switch means, for closing the second switch means and discharging the capacitor during the interval between each control pulse and the next control pulse.

2. A base drive and control circuit as claimed in claim 1, further comprising: second circuit means for tapping a voltage representative of the current; third circuit means for comparing said voltage to a predetermined threshold voltage and for generating a control signal each time the voltage representative of the current exceeds the threshold voltage; said first control means being further connected to said third circuit means for opening the first switch means each time the said control signal is generated.

3. A base drive and control circuit as claimed in claim 2, wherein said first control means comprise a latch with dominant reset, said latch having a set input, a reset input and an output said output being connected to the control input of the first switch means, the set input being connected to the secondary winding and the reset input being connected to the third circuit means.

4. A base drive and control circuit as claimed in claim 1, wherein said first circuit means comprise a resistor connected in series with the secondary winding, said first circuit means further comprising a diode, said capacitor and said diode being serially connected to form an assembly which is connected in parallel across said resistor.

5. A base drive and control circuit as claimed in claim 1, wherein said first switch means comprise a first auxiliary transistor having an emitter, a collector and a base, said emitter being connected to the secondary winding, said collector being connected to the base of the power transistor and said base forming a control input of said first switch means; said base drive and control circuit further comprising second circuit means for tapping a voltage representative of the current, said first control means comprises second and third auxiliary transistors together forming a latch and each having an emitter, a collector and a base, the collector of the second auxiliary transistor is connected to the base of the first auxiliary transistor, the collector of the third auxiliary transistor is connected to the base of the second auxiliary transistor, the emitter of the third auxiliary transistor connected to the emitter of the second auxiliary transistor and the base of the third auxiliary transistor is connected to said second circuit means whereby the third auxiliary transistor compares the voltage representative of the current to the voltage across the base and emitter of said third auxiliary transistor.

6. A base drive control circuit as claimed in claim 1, wherein said second switch means and second control means comprise a fourth auxiliary transistor having an emitter, a collector and a base, said capacitor being connected to the emitter of said fourth auxiliary transistor, and the secondary winding being connected to the base of said fourth auxiliary transistor, whereas the collector of said fourth auxiliary transistor is connected to the base of the power transistor.

7. A base drive and control circuit as claimed in claim 5, wherein said second circuit means comprise an adjustable resistor connected to the emitter of said power transistor, a further resistor connecting the emitter of said power transistor to the base of the third auxiliary transistor and fourth circuit means connecting the base of the third auxiliary transistor to the emitter of the third auxiliary transistor, said fourth circuit means comprising a further adjustable resistor and a negative temperature coefficient resistor connected in series.

8. A base drive and control circuit as claimed in claim 5, further comprising fifth circuit means supplying a voltage representative of the voltage across the collector and emitter of the power transistor and resistor means connecting the base of the third auxiliary transistor to said fifth circuit means.

9. A base drive and control circuit as claimed in claim 6, further comprising derivation circuit means connecting the base of said third auxiliary transistor to the base of said fourth auxiliary transistor.

10. A base drive and control circuit as claimed in claim 5, further comprising a resistor connecting the collector of the second auxiliary transistor to the base of the third auxiliary transistor.

* * * * *